(12) United States Patent
Chiang et al.

(10) Patent No.: US 9,728,570 B2
(45) Date of Patent: Aug. 8, 2017

(54) DEEP TRENCH ISOLATION FABRICATION FOR BSI IMAGE SENSOR

(71) Applicant: Taiwan Semiconductor Manufacturing Co., Ltd., Hsin-Chu (TW)

(72) Inventors: Yen-Ting Chiang, Tainan (TW); Ching-Chun Wang, Tainan (TW); Dun-Nian Yaung, Taipei (TW); Hsiao-Hui Tseng, Tainan (TW); Chih-Hui Huang, Yongkang (TW); Shyh-Fann Ting, Tainan (TW); Shih Pei Chou, Tainan (TW); Sheng-Chan Li, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/935,819

(22) Filed: Nov. 9, 2015

(65) Prior Publication Data
US 2017/0133414 A1    May 11, 2017

(51) Int. Cl.
*H01L 21/00*    (2006.01)
*H01L 27/146*    (2006.01)

(52) U.S. Cl.
CPC ...... *H01L 27/1463* (2013.01); *H01L 27/1464* (2013.01); *H01L 27/14621* (2013.01); *H01L 27/14627* (2013.01); *H01L 27/14636* (2013.01); *H01L 27/14685* (2013.01); *H01L 27/14689* (2013.01)

(58) Field of Classification Search
CPC . H01L 23/50; H01L 23/5383; H01L 23/5384; H01L 25/115; H01L 25/18
USPC .......................................................... 438/48
See application file for complete search history.

(56) References Cited

U.S. PATENT DOCUMENTS

| | | | |
|---|---|---|---|
| 7,015,116 B1* | 3/2006 | Lo ......................... | H01L 21/764 |
| | | | 257/E21.546 |
| 2006/0131655 A1* | 6/2006 | Kunnen ................ | H01L 21/762 |
| | | | 257/369 |
| 2007/0187734 A1* | 8/2007 | Adkisson ............ | H01L 27/1463 |
| | | | 257/293 |
| 2013/0069190 A1* | 3/2013 | Kao .................... | H01L 27/1463 |
| | | | 257/432 |
| 2014/0374868 A1* | 12/2014 | Lee ..................... | H01L 27/1463 |
| | | | 257/446 |

* cited by examiner

*Primary Examiner* — Andy Huynh
(74) *Attorney, Agent, or Firm* — Eschweiler & Potashnik, LLC

(57) ABSTRACT

The present disclosure relates to a BSI image sensor with improved DTI structures, and an associated method of formation. In some embodiments, the BSI image sensor comprises a plurality of image sensing elements disposed within a substrate corresponding to a plurality of pixel regions. A deep trench isolation (DTI) grid is disposed between adjacent image sensing elements and extending from an upper surface of the substrate to positions within the substrate. The DTI grid comprises air-gaps disposed under the upper surface of the substrate, the air-gaps having lower portions surrounded by a first dielectric layer and some upper portions sealed by a second dielectric layer.

20 Claims, 5 Drawing Sheets

DEEP TRENCH ISOLATION FABRICATION FOR BSI IMAGE SENSOR

BACKGROUND

Many modern day electronic devices include optical imaging devices (e.g., digital cameras) that use image sensors. An image sensor may be disposed on an integrated circuit (IC) which includes an array of photodetectors and supporting logic. The photodetectors, which can correspond to individual pixels, measure incident radiation (e.g., light) corresponding to an optical image, and the supporting logic facilitates readout of digital data from the IC. The digital data output from the IC corresponds to a digitally encoded representation of the optical image.

Standard IC manufacturing processes can produce image sensors that use frontside illumination (FSI) techniques or backside illumination (BSI) techniques. With FSI, light falls on a frontside of the IC, and passes through an electrical interconnect structure, such as a stack of back end of line (BEOL) metal layers, before being collected at the photodetectors which are disposed in a semiconductor substrate. Often in FSI, the BEOL metal layers are structured to have openings (apertures) over the individual photodetectors, as the material of the BEOL metal layers can otherwise block light if arranged between the incident light and the photodetectors. To optimize the amount of light that reaches the photodetectors through these apertures; microlenses, waveguides, and other optical features are often used in FSI to minimize reflections and help direct light towards the respective photodetectors.

In BSI, rather than having light pass through openings/apertures in the BEOL metal layers, the sensor is illuminated from the backside of the substrate (i.e., the face opposite the stack of BEOL metal layers). Compared to FSI, BSI allows a photodetector to have its optical path on one side of the substrate and its electrical components on the other side of the substrate, which allows better separation of optical elements from electrical elements. This means the optical path can be optimized independent of the electrical components and vice versa. The optical constraints for BSI are similar to FSI, except in BSI the photodetectors are often positioned closer to the microlenses, which are now disposed on a thinned down substrate surface. Also, because BSI removes the constraints associated with apertures in the BEOL metal layers, BSI eliminates a loss mechanism for incident light, potentially providing a higher quantum efficiency for the devices.

FSI and BSI technologies are both valuable market segments, with FSI being an established technology that is favorable in lower-cost applications with larger pixels, and BSI being an emerging technology that is favorable in higher-end applications with smaller pixels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
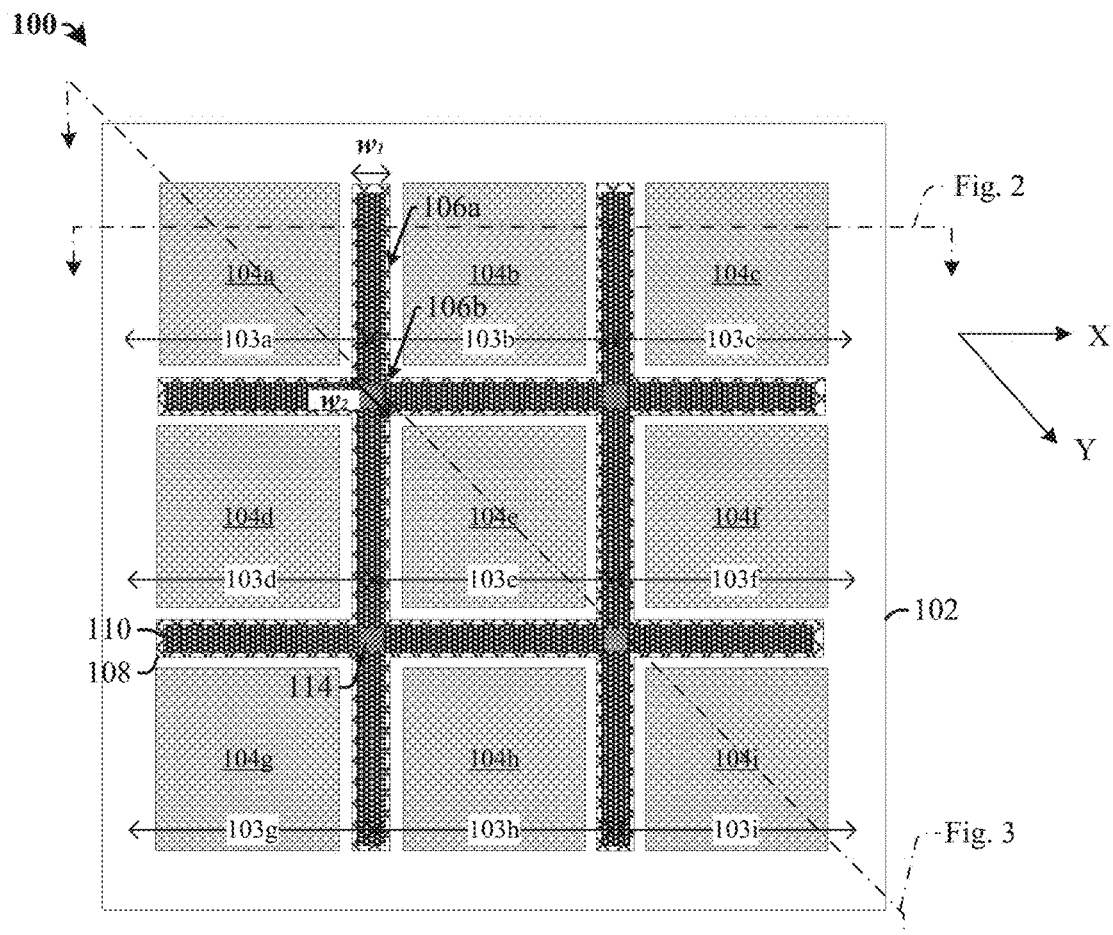
FIG. 1 illustrates a top view of some embodiments of an integrated circuit including an image sensing array isolated by a deep trench isolation (DTI) grid.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In BSI image sensors, deep trench isolation (DTI) structures are arranged between adjacent pixels to isolate neighboring pixels from one another. These DTI structures are formed by using an etch process to form a deep trench within a semiconductor substrate. This deep trench is then filled with an insulating material. In some instances, filling quality of the insulating material is imperfect. For example, if excess insulating material is formed over the semiconductor substrate, the insulating material may reduce the amount of incident radiation that reaches the image sensor. On the other hand, if too little insulating material is present, slits or air-gaps may be left within the insulating material. These slits or air gaps can allow contaminants to diffuse into the semiconductor substrate through sidewalls of the deep trench when the deep trench is formed. In either case, performance of the BSI image sensor can be degraded.

The present disclosure relates to a BSI image sensor with improved DTI structures, and an associated method of formation. In some embodiments, the BSI image sensor comprises a plurality of image sensing elements which are disposed within a substrate and which correspond to a plurality of pixel regions. A deep trench isolation (DTI) grid is disposed between adjacent image sensing elements and extends from an upper surface of the substrate to positions within the substrate. In some embodiments, the DTI grid is formed by lining a first dielectric layer along a deep trench grid followed by forming a second dielectric layer to seal remaining spaces of the deep trench grid from a top side. By forming the first dielectric layer as a conformal layer, the deep trenches are narrowed without too much overhang. By forming the second dielectric layer thereafter, the deep trenches are sealed cost effectively with a thinner redundant lateral portion over the substrate. Thereby, formation of the DTI structures is improved. As a result, in some embodiments, the DTI grid comprises air-gaps disposed under the upper surface of the substrate. The air-gaps have lower portions surrounded by the first dielectric layer. In some embodiments, some of the air-gaps are sealed by the first dielectric layer, while the other air-gaps have upper portions sealed by a combination of the first dielectric layer and the second dielectric layer.

Figure 2:
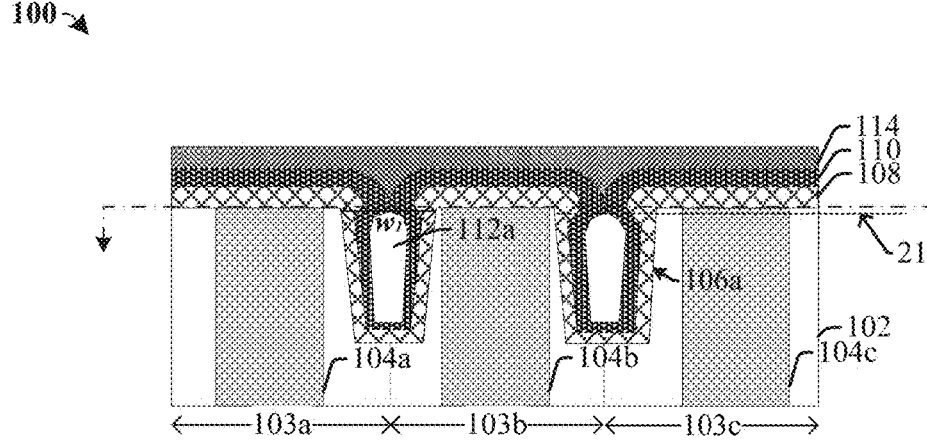
FIG. 2 illustrates a cross-sectional view of some embodiments of an integrated circuit including an image sensing array isolated by a deep trench isolation (DTI) grid along a first direction of FIG. 1.
Figure 3:
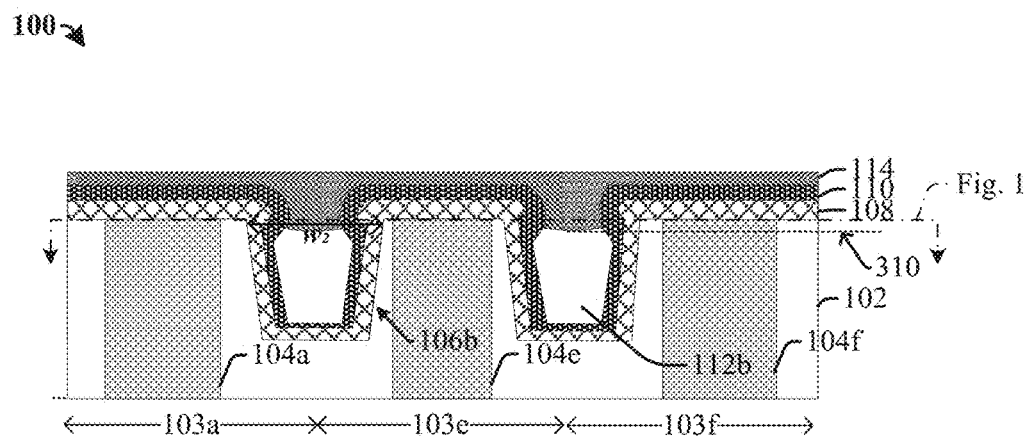
FIG. 3 illustrates a cross-sectional view of some other embodiments of an integrated circuit including an image sensing array isolated by a deep trench isolation (DTI) grid along a second direction of FIG. 1.

FIG. 1 illustrates a top view of some embodiments of an integrated circuit 100 including an image sensing array with image sensing elements isolated by a deep trench isolation (DTI) grid. FIG. 2 illustrates a cross-sectional view of some embodiments of the integrated circuit 100 along a first direction X of FIG. 1. FIG. 3 illustrates a cross-sectional view of some embodiments of the integrated circuit 100 along a second direction Y of FIG. 1.

As shown in FIG. 1, the integrated circuit 100 comprises a substrate 102 having a plurality of pixel regions 103a-103i for image sensing arranged in rows and columns. For simplicity purposes, FIG. 1 shows a 3×3 array with image sensing elements 104a-104i, but it is appreciated that the image sensing array can have pixels with any suitable number and pattern. The image sensing elements 104a-104i are disposed within the substrate 102 and correspond to the plurality of pixel regions 103a-103i. A deep trench isolation (DTI) grid 106 is disposed into a deep trench grid between adjacent image sensing elements 104a-104i and extends from an upper surface of the substrate 102 to positions within the substrate 102. The DTI grid 106 isolates the plurality of image sensing elements 104a-104i electrically and/or optically, reducing crosstalk and dark current and improving sensing performance. As shown in FIG. 2 or FIG. 3, in some embodiments, the DTI grid 106 comprises an optional passivation layer 108 lining the deep trench grid, including bottom and sidewall surfaces of the deep trench grid, and extending upwardly over the upper surface of the substrate 102. A first dielectric layer 110 is conformally disposed over the passivation layer 108, or directly lining the deep trench grid in those embodiments where the passivation layer 108 is absent. A second dielectric layer 114 is disposed over the first dielectric layer 110 and seals a remaining space of the deep trench grid from a top side to form air-gaps 112. The first dielectric layer 110 and the second dielectric layer 114 cooperatively seal the air-gaps 112 under the upper surface of the substrate 102 in a cost effective way: the conformal first dielectric layer 110 narrows the deep trench grid and the second dielectric layer 114 helps to enclose remaining spaces of the deep trench grid. Compared to an approach were only a single dielectric layer was formed through atomic layer deposition (ALD) to ensure good filling, the use of the first dielectric layer 110, which can be formed through ALD, and second dielectric layer 114, which can be formed by another process with a faster deposition rate, allows higher throughput to be realized during manufacturing while still offering good fill characteristics.

Referring back to FIG. 1, the DTI grid 106 may have a first portion 106a between two adjacent image sensing elements (e.g. 104a and 104b) in the first direction X, such as a lateral direction or a vertical direction, and a second portion 106b between two image sensing elements (e.g. 104a and 104e) in the second direction Y, such as a diagonal direction. The first portion 106a has a first width $w_1$ smaller than a second width $w_2$ of the second portion 106b. In some embodiments, the first dielectric layer 110 overlays a first air-gap 112a to a first position 210 below the upper surface of the substrate 102 at the first portion 106a of the DTI grid 106, as shown in FIG. 2. Meanwhile, the first dielectric layer 110 may not overlay an upper region of a second air-gap 112b at the second portion 106b of the DTI grid 106, as shown in FIG. 3. The second dielectric layer 114 fills in the slit of the first dielectric layer 110 between edges of the deep trench grid and extends to a second position 310 below the upper surface of the substrate 102. In some embodiments, the second dielectric layer 114 may have a planar surface. In some embodiments, the first dielectric layer 110 and the second dielectric layer 114 comprise silicon dioxide.

Figure 4:
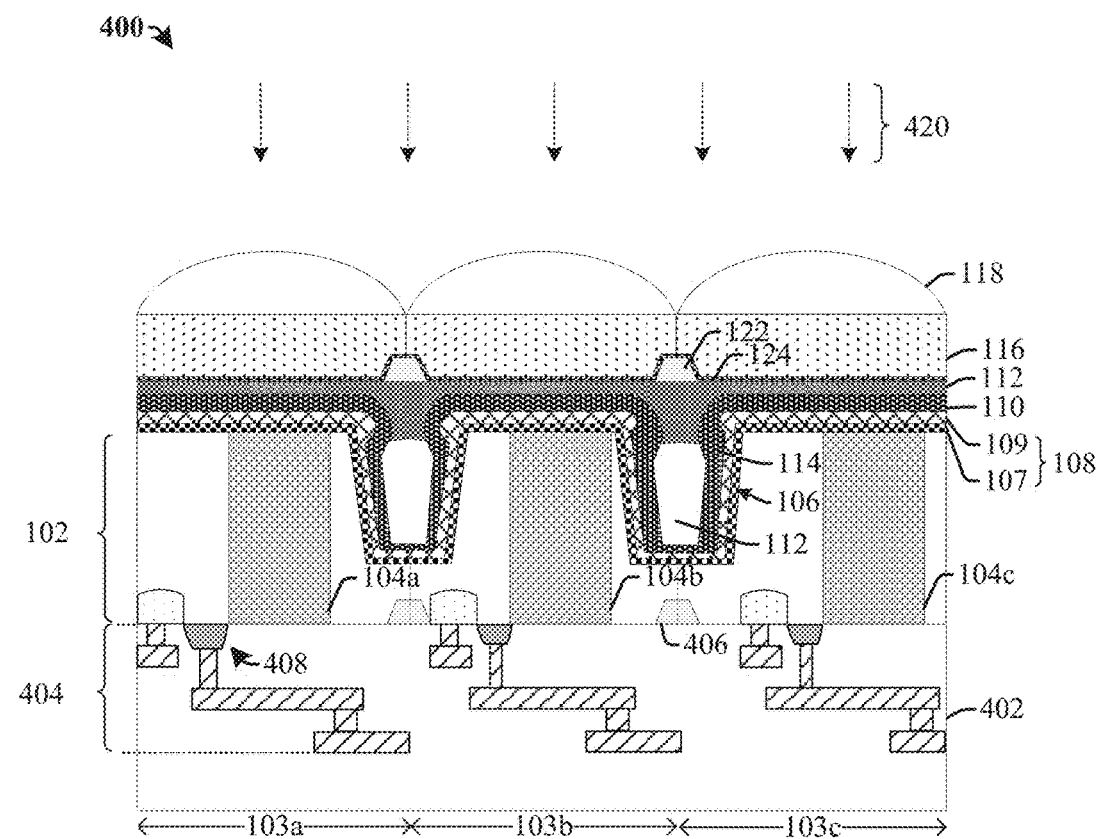
FIG. 4 illustrates a cross-sectional view of some other embodiments of an integrated circuit including an image sensing array isolated by a deep trench isolation (DTI) grid.

FIG. 4 illustrates a cross-sectional view of some other embodiments of an integrated circuit 400 including an image sensing array with image sensing elements that are isolated by a deep trench isolation (DTI) grid. In some embodiments, the integrated circuit 400 comprises a substrate 102 having a plurality of pixel regions 103a-103c. The plurality of pixel regions 103a-103c respectively comprise image sensing elements 104a-104c configured to convert incident radiation 420 (e.g., photons) into electric signals. In some embodiments, the image sensing elements 104a-104c may comprise photodiodes. In such embodiments, the photodiode may comprise a first region within the substrate 102 having a first doping type (e.g., n-type doping) and an adjoining second region within the substrate 102 having a second doping type (e.g., p-type doping) that is different than the first doping type. In some embodiments, the plurality of pixel regions 103a-103c may be arranged within the substrate 102 in an array comprising rows and/or columns.

The pixel regions 103a-103c are isolated from one another by a deep trench isolation (DTI) grid 106 extending into the substrate 102 and comprising a passivation layer 108 and a first dielectric layer 110 lining a deep trench grid. The passivation layer 108 may extend downwardly from an upper surface of the substrate 102 along surfaces of the deep trench grid and forms a protrusion at an upper edge where the deep trench grid meets the upper surface of the substrate 102. In some embodiments, the passivation layer 108 may comprise a first high-k dielectric layer 107 and a second high-k dielectric layer 109 disposed over the first high-k dielectric layer 107. The first high-k dielectric layer 107 and the second high-k dielectric layer 109 may respectively or cooperatively be configured to prevent diffusion, reduce process damage and optical cross talk. As an example, the first high-k dielectric layer 107 may comprise hafnium oxide (HfO), aluminum oxide ($Al_2O_3$) or a combination thereof, and the second high-k dielectric layer 109 may comprise titanium oxide (TiO2), tantalum oxide ($Ta_2O_5$) or a combination thereof. In some embodiments, a second dielectric layer 114 (e.g., an oxide layer) is disposed over the first dielectric layer 110. The second dielectric layer 114 fills in upper portions of recesses within an upper surface of the first dielectric layer 110 directly above the deep trench grid, sealing air-gaps 112 below the upper surface of the substrate 102.

In some embodiments, the DTI grid 106 may comprise deep trench isolation (DTI) structures that vertically extend from a back-side of the substrate 102 to a location within the substrate 102. The back-side of the substrate 102 opposes a front-side of the substrate 102 where a transfer transistor 408 is disposed thereon and coupled to an interconnect structure 404 arranged within an ILD layer 402. In some embodiments, an extra isolation structure 406, such as a shallow trench isolation (STI) structure is arranged from the front-side of the substrate 102, isolating neighboring pixels from interference.

In some embodiments, a plurality of color filters 116 are arranged over the back-side of the substrate 102 corresponding to the plurality of pixel regions 103a-103c. The plurality of color filters 116 are respectively configured to transmit specific wavelengths of incident radiation 420 to the image sensing elements 104a-104c. For example, a first color filter (e.g., a red color filter) may transmit light having wavelengths within a first range, while a second color filter may transmit light having wavelengths within a second range different than the first range. A plurality of micro-lenses 118 are arranged over the plurality of color filters 116. Respective micro-lenses 118 are aligned laterally with the color filters 116 and overlie the pixel regions 103a-103c. The micro-lenses 118 are configured to focus the incident radiation 420 (e.g., light) towards the pixel regions 103a-103c. In some embodiments, a metal grid 122 is disposed over the second dielectric layer 114 between adjacent ones of the plurality of color filters 116. A third dielectric layer 124 can be disposed over the second dielectric layer 114 and lining the metal grid 122.

FIGS. 5-11 illustrate some embodiments of cross-sectional views showing a method of forming an integrated circuit including an image sensing array isolated by a deep trench isolation (DTI) grid.

Figure 5:
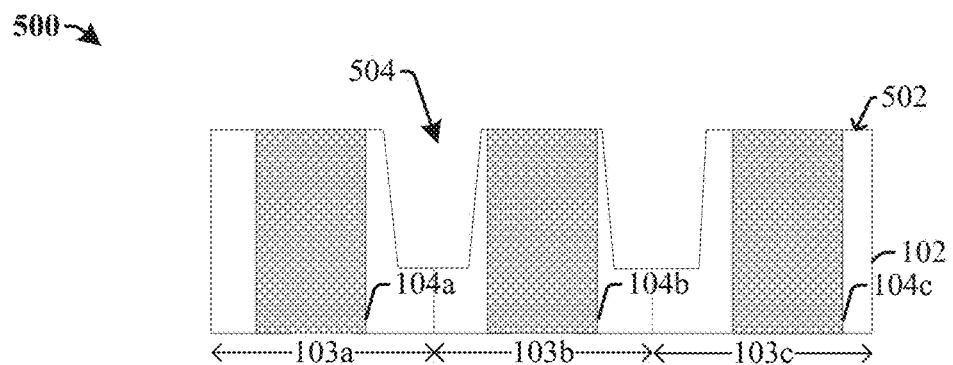
FIGS. 5-11 illustrate some embodiments of cross-sectional views showing a method of forming an integrated circuit including an image sensing array isolated by a deep trench isolation (DTI) grid.

As shown in cross-sectional view 500 of FIG. 5, a deep trench grid 504 is formed from an upper surface 502 of a substrate 102 at a back side of the substrate 102. The substrate 102 has a plurality of pixel regions 103a-103c. The plurality of pixel regions 103a-103c respectively comprise image sensing elements 104a-104c configured to convert incident radiation into electric signals. The deep trench grid 504 can be etched between image sensing elements 104a-104c, with each trench including inner tilted sidewalls that extend downwardly to a bottom surface of the trench. Widths of a deep trench opening near the upper surface 502 may vary according to distances between the image sensing elements 104a-104c. In various embodiments, the substrate 102 may comprise any type of semiconductor body (e.g., silicon/CMOS bulk, SiGe, SOI, etc.) such as a semiconductor wafer or one or more die on a wafer, as well as any other type of semiconductor and/or epitaxial layers formed thereon and/or otherwise associated therewith. In some embodiments, manufacturing processes are performed at a front side of the substrate 102 before flipping and thinning the substrate 102 for the formation the deep trench grid 504. The image sensing elements 104a-104c can be formed within the substrate 102 from the front side through implantation or epitaxial growth. Transfer transistors can be formed at the front side of the substrate 102, coupling to the image sensing elements 104a-104c. A back-end-of-the-line (BEOL) metallization stack can be formed at the front-side of the substrate 102. The BEOL metallization stack can comprise a plurality of metal interconnect layers arranged within one or more inter-level dielectric layers.

Figure 6:
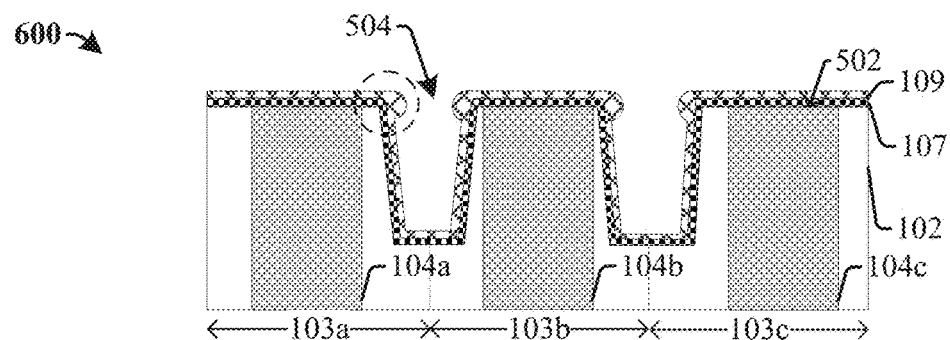

As shown in cross-sectional view 600 of FIG. 6, a first high-k dielectric layer 107 and a second high-k dielectric layer 109 can be formed lining the deep trench grid 504. In some embodiments, the first high-k dielectric layer 107 and/or the second high-k dielectric layer 109 can be formed by a sputtering deposition process, lining bottom and sidewall surfaces of the deep trench grid and extending over the upper surface 502 of the substrate 102. In some embodiments, a protrusion (circled by dash-lines) can be formed at an edge that the deep trench grid 504 and the upper surface 502 of the substrate 102 meet, narrowing the deep trench opening. The first and second high-k dielectric layers can be made of the same or different materials, and can be formed by the same or different processes, depending on the implementation.

Figure 7:
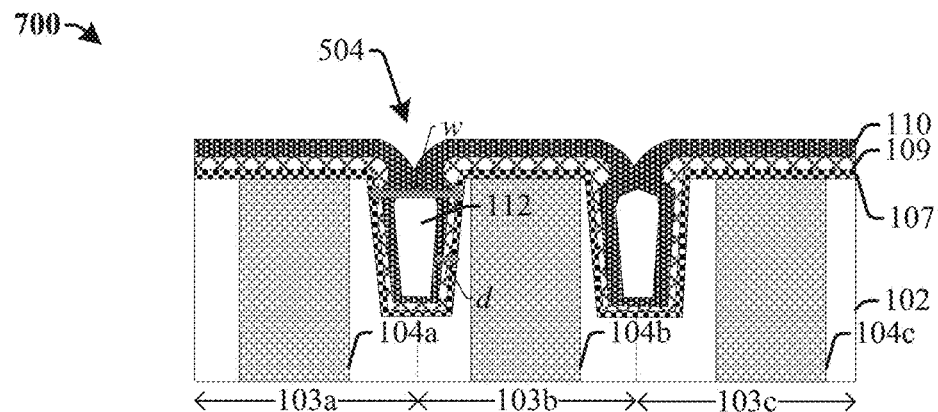

As shown in cross-sectional view 700 of FIG. 7, a first dielectric layer 110 can be formed over the second high-k dielectric layer 109. In some embodiments, the first dielectric layer 110 can be a conformal layer. The first dielectric layer 110 can be formed by atomic layer deposition techniques such as a plasma enhanced atomic layer deposition (PEALD). ALD techniques provide excellent filling, but may be slow from a throughput perspective. The first dielectric layer 110 can be deposited with a thickness in a range of from about 30 nm to about 80 nm. In some embodiments, an overall thickness d of the high-k dielectric layers 107, 109 and the first dielectric layer 110 can be about ⅙ to an opening width w of the deep trench opening. The first dielectric layer 110 may seal some narrower portions of the deep trench grid 504 from a top side as shown in FIG. 7. Though not shown in FIG. 7, in some embodiments, the first dielectric layer 110 may not overlay an upper region of some wider portions of the deep trench grid 504, such as diagonal regions as shown in FIG. 1 and FIG. 2.

Figure 8:
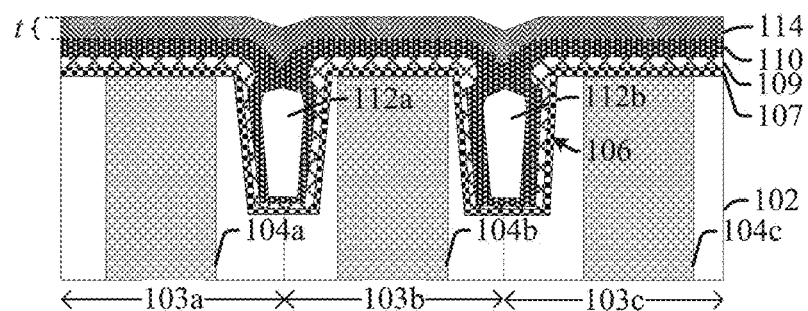

As shown in cross-sectional view 800 of FIG. 8, a second dielectric layer 114 can be formed over the first dielectric layer 110. In some embodiments, the second dielectric layer 114 is formed by a deposition process with a growth rate much higher than that of the first dielectric layer 110. Thus, whereas the first growth rate of the first dielectric layer 110 may be low with excellent filling characteristics, the growth rate of the second dielectric layer 114 is faster to provide a good balance between throughput and filling quality. For example, the second dielectric layer 114 can be formed at a growth rate of about 150 Å/s while the first dielectric layer 110 can be formed at a growth rate of about 1 Å/s. The second dielectric layer 114 can be formed by chemical vapor deposition techniques such as a plasma enhanced chemical vapor deposition (PECVD). The second dielectric layer 114 can be deposited directly on the first dielectric layer 110, filling recesses within an upper surface of the first dielectric layer 110 directly above the deep trench grid 504. In some embodiments, the second dielectric layer 114 can be formed with a thickness in a range of from about 50 nm to about 100 nm. Remaining spaces of the deep trench grid 504 are sealed to form air-gaps 112 under the upper surface of the substrate 102. An overall thickness of the first dielectric layer 110 and the second dielectric layer 114 is relatively small since the first dielectric layer 110 and the second dielectric layer 114 cooperatively form the air-gaps 112 in an efficient manner. In some embodiments, the second dielectric layer 114 is planarized after the deposition, for example, using a chemical mechanical polishing (CMP) process.

Figure 9:
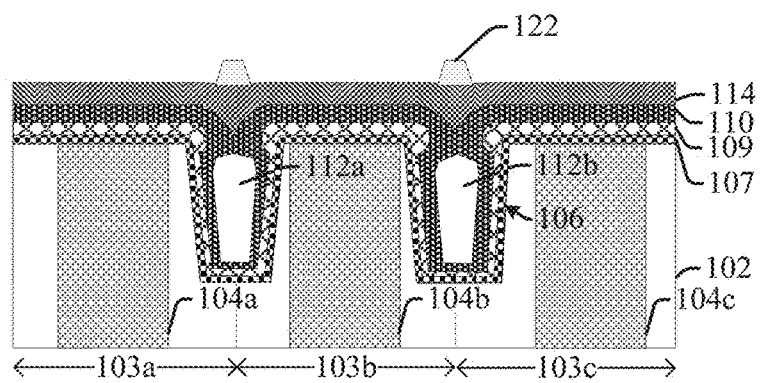

As shown in cross-sectional view 900 of FIG. 9, a metal grid 122 can be formed over the second dielectric layer 114, providing isolation and redirection for the incoming radiance during operations. The metal grid 122 can be formed with a stack of metal and dielectric films, such as titanium nitride, tungsten, and so on. The metal grid 122 may be formed by deposition processes (e.g. PVD, CVD) followed by patterning processes.

Figure 10:
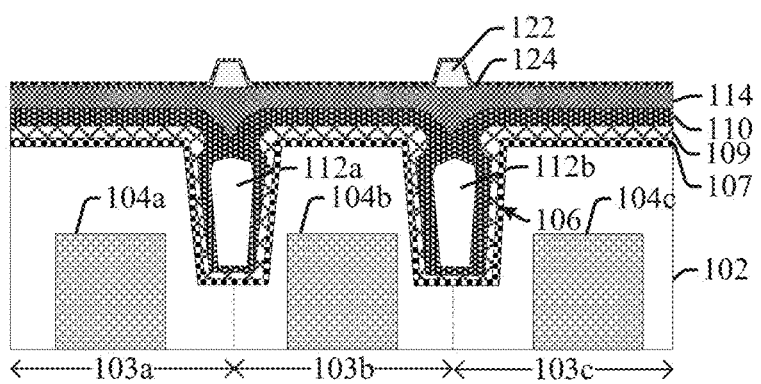

As shown in cross-sectional view 1000 of FIG. 10, a third dielectric layer 124 can be formed lining the metal grid 122. The third dielectric layer 124 may be a conformal layer.

Figure 11:
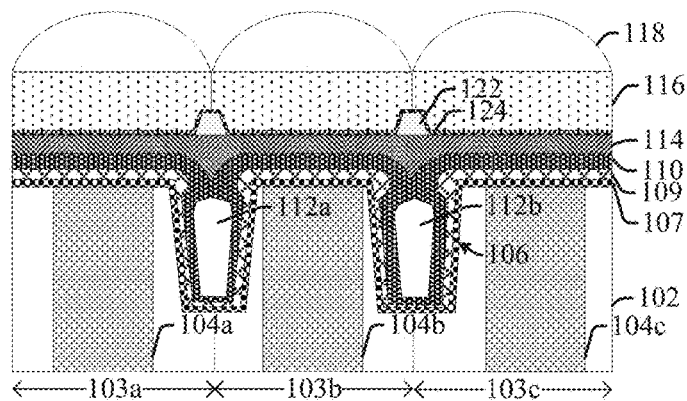

As shown in cross-sectional view 1100 of FIG. 11, a plurality of color filters 116 are formed over the third dielectric layer 124. In some embodiments, the plurality of color filters 116 may be formed by forming a color filter layer and patterning the color filter layer. The color filter layer is formed of a material that allows for the transmission of radiation (e.g., light) having a specific range of wavelength, while blocking light of wavelengths outside of the specified range. Further, in some embodiments, the color filter layer is planarized subsequent to formation.

A plurality of micro-lenses 118 are formed over the plurality of color filters 116. In some embodiments, the plurality of micro-lenses 118 may be formed by depositing a micro-lens material above the plurality of color filters 116 (e.g., by a spin-on method or a deposition process). A micro-lens template (not shown) having a curved upper surface is patterned above the micro-lens material. In some embodiments, the micro-lens template may comprise a photoresist material exposed using a distributing exposing light dose (e.g., for a negative photoresist more light is exposed at a bottom of the curvature and less light is exposed at a top of the curvature), developed and baked to form a rounding shape. The plurality of micro-lenses 118 are then formed by selectively etching the micro-lens material according to the micro-lens template. The micro-lens 118 may also be formed off-wafer and then adhered to the color filters 116 after being formed.

Figure 12:
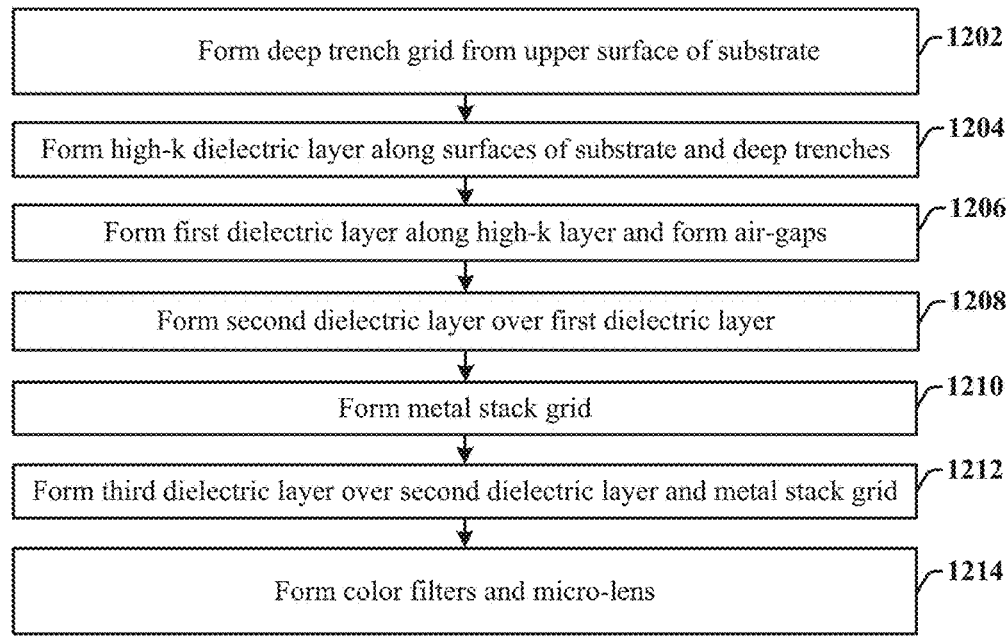
FIG. 12 illustrates a flow diagram of some embodiments of a method of forming an integrated circuit including an image sensing array isolated by a deep trench isolation (DTI) grid.

FIG. 12 illustrates a flow diagram of some additional embodiments of a method 1200 of forming an integrated circuit including an image sensing array isolated by a deep trench isolation (DTI) grid.

While disclosed method 1200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases At 1202, a deep trench grid can be formed from an upper surface of a substrate. The deep trench grid may extend to lower positions within the substrate. FIG. 5 illustrates a cross-sectional view corresponding to some embodiments corresponding to act 1202.

At 1204, a high-k dielectric layer is formed along surfaces of the deep trench grid and the substrate. In some embodiments, the high-k dielectric layer is configured as a passivation layer to help to reduce dark current and optical and/or electrical interference. The high-k dielectric layer can be deposited by sputtering, forming a protrusion at upper edges of the deep trench grid. FIG. 6 illustrates a cross-sectional view corresponding to some embodiments corresponding to act 1204.

At 1206, a first dielectric layer is formed over the high-k dielectric layer. In some embodiments, the first dielectric layer can be a conformal layer. FIG. 7 illustrates a cross-sectional view corresponding to some embodiments corresponding to act 1206.

At 1208, a second dielectric layer is formed over the first dielectric layer. The second dielectric layer seals remaining spaces of the deep trench grid from a top side to form air-gaps under the upper surface of the substrate 102. FIG. 8 illustrates a cross-sectional view corresponding to some embodiments corresponding to act 1208.

At 1210, a metal stack grid is formed over the second dielectric layer. FIG. 9 illustrates a cross-sectional view corresponding to some embodiments corresponding to act 1210.

At 1212, a third dielectric layer is formed over the second dielectric layer and the metal stack grid. In some embodiments, the third dielectric layer is a conformal layer, lining an upper surface of the second dielectric layer and the metal stack grid. FIG. 10 illustrates a cross-sectional view corresponding to some embodiments corresponding to act 1212.

At 1214, color filters and micro-lens are formed over the third dielectric layer. FIG. 11 illustrates a cross-sectional view corresponding to some embodiments corresponding to act 1214.

Therefore, the present disclosure relates to a BSI image sensor with improved DTI structures, and an associated method of formation. In some embodiments, a DTI grid is formed by lining a first dielectric layer along deep trenches followed by forming a second dielectric layer to seal remaining spaces of the deep trenches from a top side. By forming the first dielectric layer in conformal, the deep trenches is narrowed without too much overhang. By forming the second dielectric layer thereafter, the deep trenches are sealed cost effectively with a thinner redundant lateral portion over the substrate.

In some embodiments, the present disclosure relates an integrated circuit including an image sensing array. The integrated circuit comprises a substrate comprising a plurality of pixel regions arranged one next to another and a plurality of image sensing elements disposed within the substrate corresponding to the plurality of pixel regions. The integrated circuit further comprises a deep trench isolation (DTI) grid disposed between adjacent image sensing elements and extending from an upper surface of the substrate to positions within the substrate. The DTI grid comprises air-gaps disposed under the upper surface of the substrate, the air-gaps having lower portions surrounded by a first dielectric layer and some upper portions sealed by a second dielectric layer.

In yet other embodiments, the present disclosure relates to method of an integrated circuit. The method comprises forming a deep trench grid from an upper surface of a substrate at a back side of the substrate and forming a first dielectric layer lining the deep trench grid and extending over the upper surface of the substrate. The method further comprises forming a second dielectric layer over the first dielectric layer and enclosing remaining spaces of the deep trench grid to form air-gaps at lower portions of the deep trench. The air-gaps are sealed by the first dielectric layer or the second dielectric layer below the upper surface of the substrate.

In yet other embodiments, the present disclosure relates to method of an integrated circuit. The method comprises performing an etch to form a deep trench grid from an upper surface of a substrate and forming a first silicon dioxide layer by plasma enhanced atomic layer deposition (PEALD) lining the deep trench grid and extending over the upper surface of the substrate. The method further comprises forming a second silicon dioxide layer over the first silicon dioxide layer formed by plasma enhanced chemical vapor deposition (PECVD) to enclose remaining spaces of the deep trench grid from a top side to form air-gaps at lower portions of the deep trench grid.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, comprising:
    forming a deep trench grid from an upper surface of a substrate at a back side of the substrate;
    forming a passivation layer lining the deep trench grid within the substrate, the passivation layer including a first high-k dielectric layer and a second high-k dielectric layer disposed over the first high-k dielectric layer;
    forming a first dielectric layer over the passivation layer, lining the deep trench grid and extending over the upper surface of the substrate; and
    forming a second dielectric layer over the first dielectric layer and enclosing remaining spaces of the deep trench grid to form air-gaps at lower portions of the deep trench grid;
    wherein the air-gaps are sealed by the first dielectric layer or the second dielectric layer below the upper surface of the substrate.

2. The method of claim 1, wherein the first dielectric layer is a conformal layer by plasma enhanced atomic layer deposition (PEALD) and the second dielectric layer is formed by plasma enhanced chemical vapor deposition (PECVD).

3. The method of claim 1, further comprising:
    before forming the deep trench grid, forming image sensing elements from a front side of the substrate that is opposite to the back side;
    forming transfer transistors at the front side of the substrate, the transfer transistors being coupled to the image sensing elements; and
    forming a back-end-of-the-line (BEOL) metallization stack at the front side of the substrate, wherein the BEOL metallization stack comprises a plurality of metal interconnect layers arranged within one or more inter-level dielectric layers.

4. The method of claim 1, further comprising:
    after forming the air-gaps, forming a plurality of color filters over the second dielectric layer between the deep trench grid; and
    forming micro-lens overlying the color filters.

5. The method of claim 4, further comprising:
    forming a metal grid over the second dielectric layer between adjacent ones of the plurality of color filters; and
    forming a third dielectric layer over the second dielectric layer and lining the metal grid.

6. The method of claim 1, wherein the passivation layer is formed continuously lining the deep trench grid and extending over the upper surface of the substrate.

7. The method of claim 6, the first high-k dielectric layer comprising hafnium oxide (HfO), aluminum oxide ($Al_2O_3$) or a combination thereof.

8. The method of claim 6, the second high-k dielectric layer comprising titanium oxide (TiO2), tantalum oxide ($Ta_2O_5$) or a combination thereof.

9. A method of forming an integrated circuit, comprising:
    performing an etch to form a deep trench grid from an upper surface of a substrate;
    forming a passivation layer extending downwardly along surfaces of the deep trench grid and protruding towards an opening of the deep trench grid at an upper edge where the deep trench grid meets the upper surface of the substrate;
    forming a first dielectric layer lining the deep trench grid and extending over the upper surface of the substrate, wherein the first dielectric layer has a protrusion to narrow the opening of the deep trench grid at the upper edge where the deep trench grid meets the upper surface of the substrate; and
    forming a second dielectric layer over the first dielectric layer to enclose remaining spaces of the deep trench grid to form and seal air-gaps.

10. The method of claim 9, wherein the protrusion of the first dielectric layer extends and seals the deep trench grid from a top side overlying the air-gaps.

11. The method of claim 9, further comprising:
    forming a metal grid over the second dielectric layer overlying the deep trench grid;
    forming a third dielectric layer over the second dielectric layer and lining the metal grid;
    forming color filters over the third dielectric layer; and
    forming micro-lens overlying the color filters.

12. The method of claim 9, further comprising:
    forming image sensing elements at a front side of the substrate; and
    forming a back-end-of-the-line (BEOL) metallization stack over the image sensing elements, wherein the BEOL metallization stack comprises a plurality of metal interconnect layers arranged within one or more inter-level dielectric layers.

13. The method of claim 9, wherein the passivation layer includes a first high-k dielectric layer and a second high-k dielectric layer disposed over the first high-k dielectric layer.

14. A method of forming an integrated circuit, comprising:
    forming a substrate comprising a plurality of pixel regions arranged one next to another;
    forming a plurality of image sensing elements within the substrate corresponding to the plurality of pixel regions;
    forming a deep trench isolation (DTI) grid between adjacent image sensing elements and extending from an upper surface of the substrate to positions within the substrate; and
    forming a passivation layer continuously extending over the upper surface of the substrate and lining the DTI grid within the substrate;
    wherein the DTI grid is formed to have air-gaps under the upper surface of the substrate, wherein the air-gaps have lower portions surrounded by a first dielectric layer and wherein some of the air-gaps have upper portions sealed by a second dielectric layer.

15. The method of claim 14, wherein forming the DTI grid further comprises:
    forming the first dielectric layer disposed conformally over the passivation layer; and forming the second dielectric layer disposed over the first dielectric layer and sealing the air-gaps from a top side.

16. The method of claim 15, wherein the first dielectric layer and the second dielectric layer are formed using silicon dioxide.

17. The method of claim 15, further comprising:
forming a plurality of color filters disposed over the substrate corresponding to the plurality of pixel regions, the plurality of color filters configured to transmit specific wavelengths of incident radiation to the image sensing elements;
forming a metal grid disposed over the second dielectric layer between adjacent ones of the plurality of color filters; and
forming a third dielectric layer disposed over the second dielectric layer and lining the metal grid.

18. The method of claim 14, wherein the passivation layer is formed to include a first high-k dielectric layer and a second high-k dielectric layer disposed over the first high-k dielectric layer.

19. The method of claim 14, wherein the image sensing elements are respectively formed to include a photodiode having a first region with a first doping type and a second region with a second doping type that is different than the first doping type.

20. The method of claim 14, wherein the passivation layer is formed to include a protrusion to narrow an opening of the DTI grid at an upper edge where the DTI grid meets the upper surface of the substrate.

* * * * *